(12) United States Patent
Jung et al.

(10) Patent No.: US 6,498,085 B2
(45) Date of Patent: Dec. 24, 2002

(54) SEMICONDUCTOR DEVICE AND METHOD OF FABRICATING THE SAME

(75) Inventors: Jong-Wan Jung, Choongcheongbuk-Do (KR); Jeong Seok Nam, Choongcheongbuk-Do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/726,441

(22) Filed: Dec. 1, 2000

(65) Prior Publication Data

US 2001/0010381 A1 Aug. 2, 2001

(30) Foreign Application Priority Data

Jan. 27, 2000 (KR) .......................................... 2000-3939

(51) Int. Cl.⁷ ................. H01L 21/3205; H01L 21/4763; H01L 21/265; H01L 21/336
(52) U.S. Cl. ..................... 438/596; 438/520; 438/302; 438/305
(58) Field of Search ................................ 438/520, 585, 438/521, 528, 596, 301, 302, 305

(56) References Cited

U.S. PATENT DOCUMENTS

| | | | |
|---|---|---|---|
| 4,714,519 A | * 12/1987 | Pfiester ........................ 257/336 |
| 4,988,638 A | * 1/1991 | Huang et al. ................ 438/154 |
| 5,550,397 A | * 8/1996 | Lifshitz et al. .............. 257/347 |
| 5,693,961 A | * 12/1997 | Hamada ....................... 257/297 |
| 5,804,496 A | * 9/1998 | Duane .......................... 438/520 |
| 5,891,782 A | * 4/1999 | Hsu et al. .................... 438/289 |
| 5,969,385 A | * 10/1999 | Nathanson ................... 257/347 |
| 6,091,118 A | * 7/2000 | Duane .......................... 257/364 |
| 6,291,325 B1 | * 9/2001 | Hsu ............................. 438/525 |
| 6,323,985 B1 | * 11/2001 | Maloney ...................... 257/446 |

\* cited by examiner

*Primary Examiner*—John F. Niebling
*Assistant Examiner*—Walter Lindsay
(74) *Attorney, Agent, or Firm*—Morgan, Lewis & Bockius LLP

(57) ABSTRACT

The claimed invention relates to a semiconductor device and a method of fabricating the semiconductor device. More particularly, the claimed invention relates to a method of fabricating the semiconductor device in which parts of a gate electrode at the ends of a channel are lightly doped compared to the center part of the gate electrode, thereby eliminating a hump on a subthreshold current slope. To achieve the objects of the claimed invention, there is provided a semiconductor device that includes a semiconductor substrate divided into an isolation region and an active region. A gate oxide film is formed on a first upper surface of the active region. A gate electrode is formed on a second upper surface of the gate oxide film, the gate electrode having a first part and a second part. The first part is more lightly doped with impurities than the second part. A channel is formed in an upper end of the active region proximate the gate electrode. A source and a drain are formed in the active region on opposite sides of the gate electrode.

9 Claims, 7 Drawing Sheets

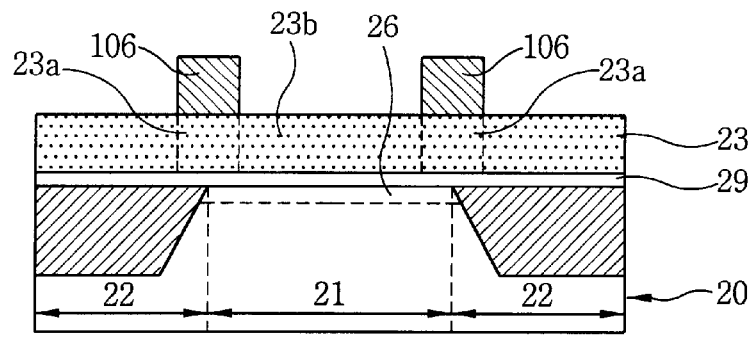
FIG.4D
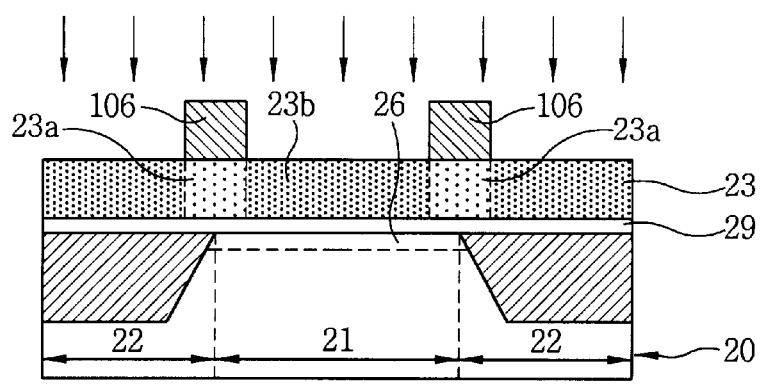
FIG.4E
FIG.5A
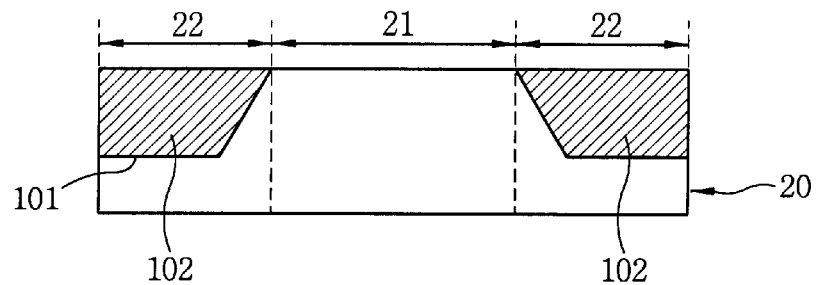

SEMICONDUCTOR DEVICE AND METHOD OF FABRICATING THE SAME

This Application claims the benefit of Korean application No. 3939/2000 filed on Jan. 27, 2000 which is hereby incorporated by reference.

BACKGROUND OF THE INVENTION

1. Field of the Invention

The claimed invention relates to a semiconductor device and a method of fabricating the semiconductor device. More particularly, the claimed invention relates to a method of fabricating the semiconductor device wherein a hump on a subthreshold current slope is eliminated.

2. Discussion of the Related Art

A conventional n-channel metal oxide semiconductor field effect transistor (MOSFET) device is schematically illustrated in FIG. 1. A semiconductor substrate 10 is divided into an active region 11 and an isolation region 12. The substrate 10 is a p-type substrate doped with p-type impurities, such as Boron (B). The active region 11 forms a transistor, and the isolation region 12 electrically isolates the transistor from other transistors (not shown). It is known to form the isolation region 12 using a field oxide film which is formed by a local oxidation of silicon (LOCOS) method. It is also known to use a shallow trench isolation (STI) method to enhance the integrity of the semiconductor.

A gate electrode 13 is formed across a center of the active region 11. A source 14 and a drain 15 are formed in the active region 11. The source 14 and the drain 15 are separated by and are on opposing sides of the gate electrode 13. The source 14 and the drain 15 are doped with n-type impurities, such as phosphorus (P) or arsenic (As).

A disadvantage of using the trench isolation structure described above to fabricate n-channel transistors is that a hump occurs in a subthreshold current region. Electric fields concentrate along ends of a channel region (not shown), so that the threshold voltage is lower along the ends of the channel region than at a center portion (not shown) of the channel. The result is current leakage due to subthreshold current flows at the ends of the channel.

The areas where subthreshold current leakage occurs are indicated by A1 and A2 in FIG. 1. A first area A1 is elliptically shaped with a first major axis parallel to a longitudinal axis of the substrate 10. A first minor axis of the first area A1 lies on an axial axis of the substrate 10. A first region of the first area A1 spans the first major axis and encompasses a first portion of the gate electrode 13 and two equal portions of the isolation region 12, the two equal portions of the isolation region 12 being opposite the gate electrode 13. A second region of the first area A1 spans the first major axis and encompasses a second portion of the gate electrode 13, a first portion of the source 14 and a first portion of the drain 15, the first source portion being equal in surface area to the first drain portion.

A second area A2 is elliptically shaped with a second major axis parallel to the longitudinal axis of the substrate 10. A second minor axis of the second area A2 lies on the axial axis of the substrate 10. A first region of the second area A2 spans the second major axis and encompasses a third portion of the gate electrode 13, a second portion of the source 14 and a second portion of the drain 15, the second source portion being equal in surface area to the second drain portion. A second region of the second area A2 spans the second major axis and encompasses a fourth portion of the gate electrode 13 and two equal portions of the isolation region 12 being opposite the gate electrode 13.

Subthreshold current leakage occurs in the first area A1 and the second area A2. To solve this problem, it is known to increase the concentration of impurities, such as B at the ends of the channel region (not shown). In other words, a conventional solution to the hump occurrence is to increase the threshold voltage at the ends of the channel by implanting B ions into the sidewalls of the channel. However, this conventional solution results in decreased performance of the semiconductor device.

SUMMARY OF THE INVENTION

The claimed invention relates to a semiconductor device and a method of fabricating the semiconductor device that substantially obviates the decreased performance of semiconductor devices due to the limitations and disadvantages of the related art described above.

Accordingly, it is an object of the claimed invention to provide a gate electrode with differently doped parts so that a threshold voltage along a channel is substantially uniform. Another object of the claimed invention is to maintain the threshold voltage at ends of the channel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the claimed invention, as embodied and broadly described, a semiconductor device of the claimed invention and a method of fabricating the device includes a semiconductor substrate divided into an isolation region and an active region. A gate oxide film is formed on a first upper surface of the active region. A gate electrode is formed on a second upper surface of the gate oxide film, the gate electrode having a first part and a second part, wherein the first part is more lightly doped with impurities than the second part. A channel is formed in an upper end of the active region proximate the gate electrode. A source is formed in the active region at a first side of the gate electrode and a drain is formed in the active region at a second side of the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 4A through 4E are cross-sectional views along line III—III of FIG. 2 illustrating a first embodiment of the semiconductor fabricated according to the claimed invention;

FIGS. 5A through 5E are cross-sectional views along line III—III of FIG. 2 illustrating a second embodiment of the semiconductor fabricated according to the claimed invention.

DETAILED DESCRIPTION OF THE PREFERRED EMBODIMENTS

Reference will now be made in detail to the preferred embodiments of the claimed invention, examples of which are illustrated in the accompanying drawings.

Figure 1:
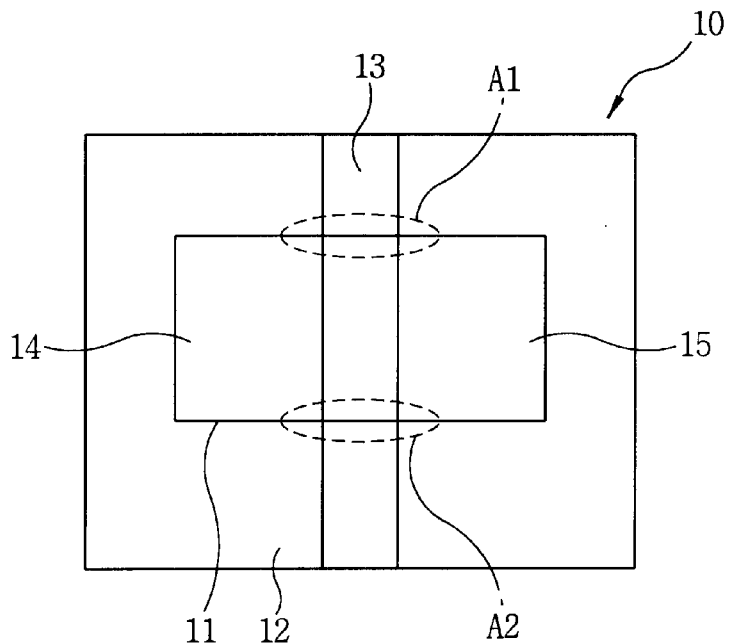
FIG. 1 is a plan view of a conventional semiconductor device.
Figure 2:
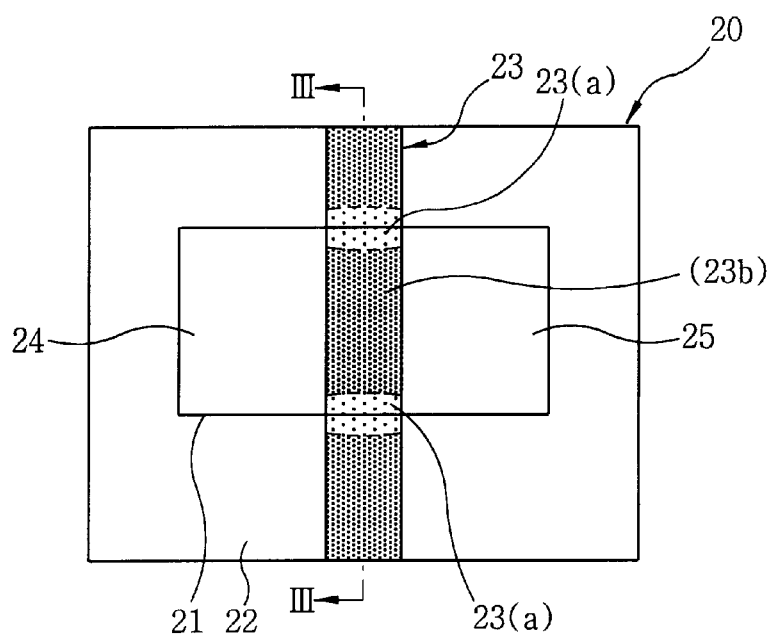
FIG. 2 is a plan view of a semiconductor device according to the claimed invention.

Referring to FIG. 2, a semiconductor substrate 20 is divided into an active region 21 and an isolation region 22. A semiconductor device (not shown) is to be formed within the active region, and the isolation region 22 electrically isolates the active region 21 from other active regions (not shown). A gate electrode 23 bisects and crosses the active region 21 along an axial axis (not shown). The gate electrode 23 is rectangular with a major axis coincident with the axial axis. A source 24 and a drain 25 are located within the active region 21 and on opposing sides of the gate electrode 23. The first part 23a of the gate electrode is positioned on opposing sides of a longitudinal axis (not shown). A center part 23b of the gate electrode 23 is interposed between the first part 23a.

Figure 3:
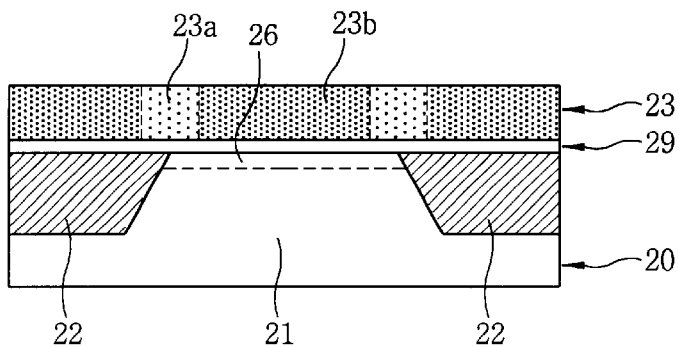
FIG. 3 is a vertical cross-sectional view of the semiconductor according to the claimed invention along line III—III of FIG. 2.

Referring to FIG. 3, a center channel 26 is formed in an upper end of the active region 21 and positioned underneath the first part 23a and the center part 23b. A gate oxide film 29 is formed on an entire upper surface of the active region 21 and the isolation region 22 and is interposed between the gate electrode 23 and the active region 21 and the isolation region 22. The first part 23a is doped with impurities of a first type, i.e., p-type or n-type, at a first concentration, the first concentration being close to zero. The center part 23b is doped with impurities of a second type, the second type opposite to the first type, at a second concentration, the second concentration being greater than the first concentration. In general, the concentration of electric fields is greater in heavily doped regions than in lightly doped regions. Because electric fields concentrate in the first part 23a, the greater doping concentration in the center part 23b results in an effective threshold voltage substantially uniform along the channel 26, thereby alleviating the concentration of electric fields observed in the related art. In other words, the claimed invention obtains a planar subthreshold current slope without a hump.

Figure 4A:
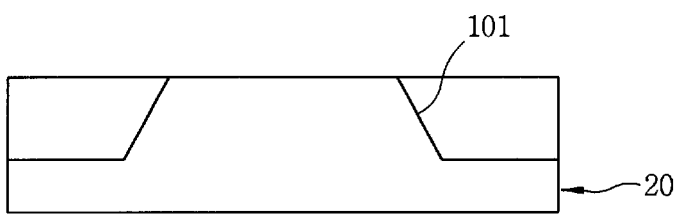
Figure 4B:
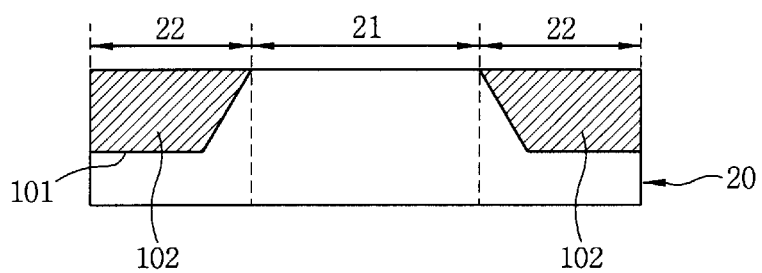

A first embodiment of a semiconductor device fabricated according to the claimed invention is illustrated in FIGS. 4A through 4E. Those parts which are common to the claimed invention as illustrated in FIGS. 2 and 3 are identified by the same numerals and will not be described in detail. Referring to FIGS. 4A and 4B, a trench 101 is formed on a portion of a semiconductor substrate 20. The trench 101 is filled with an insulating film 102, such as silicon oxide to form an isolation region 22, thereby dividing the substrate 20 into the isolation region 22 and an active region 21.

Figure 4C:
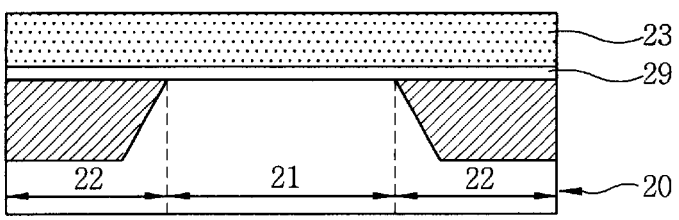

Referring to FIG. 4C, a gate oxide film 29 is formed sequentially on an entire upper surface of the active region 21 and the isolation region 22. A polysilicon film is formed on the gate oxide film 29. The polysilicon film is doped with impurities of the first type at the first concentration and then patterned, thereby forming a polysilicon film pattern, i.e., a gate electrode 23.

Referring to FIG. 4D, a first ion-implanting mask 106 is formed on the first part 23a proximate the ends of a channel 26 to be formed underneath the gate electrode 23 in an upper end of the active region 21. Referring to FIG. 4E, impurity ions of n-type or p-type are implanted into the gate electrode 23 using the first ion-implanting mask 106 wherein the implantation dosage is $1 \times 10^{15}$ atoms/cm$^2$. The concentration of impurities in the first part 23a is at the first concentration and the center part 23b is at a second concentration, the second concentration being greater than the first concentration.

Thereafter, impurity ions are implanted into the active region 21 thereby forming a source 24 (not shown in FIGS. 4A through 4E) and a drain 25 (not shown in FIGS. 4A through 4E).

Figure 5B:
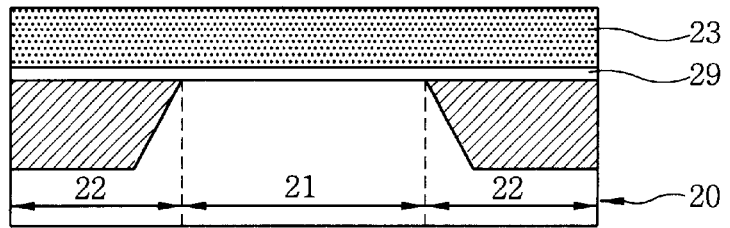

A second embodiment of the semiconductor fabricated according to the claimed invention is illustrated in FIGS. 5A through 5E. Those parts which are common to the claimed invention as illustrated by FIGS. 2, 3, and 4A through 4E are identified by the same numerals and will not be described in detail. Referring to FIG. 5A, a trench 101 is formed on a portion of a semiconductor substrate 20. The trench 101 is filled with an insulating film 102, such as silicon oxide to form an isolation region 22, thereby dividing the substrate 20 into the isolation region 22 and an active region 21.

Referring to FIG. 5B, a gate oxide film 29 is formed on an entire upper surface of the active region 21 and the isolation region 22. An inductive film, preferably a polysilicon film doped with n-type or p-type impurities at a first concentration, is sequentially formed on the gate oxide film 29. Doping the polysilicon is accomplished by the in-situ doping method or the ion implanting method. In the in-situ doping method, impurities are placed into a process chamber and both deposition and doping are performed during the process of depositing polysilicon. In the ion implanting method, polysilicon that has not been doped with impurities is deposited followed by implanting ions into the polysilicon. The preferred implantation dosage is $1 \times 10^{15}$ atoms/cm$^2$. The inductive film is then patterned, thereby forming a gate electrode 23.

Figure 5C:
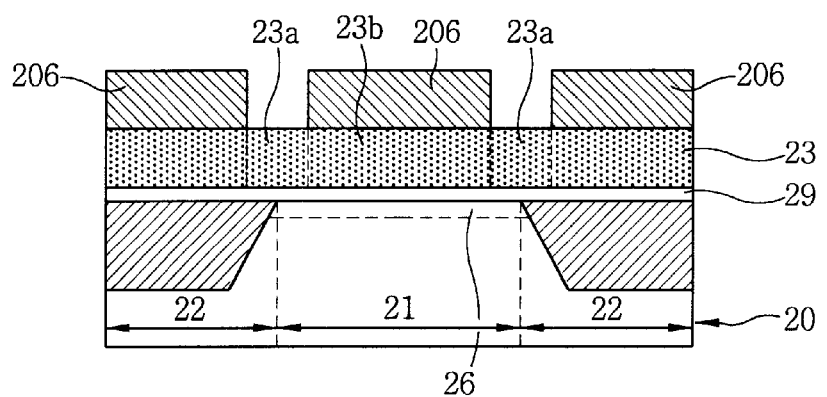
Figure 5D:
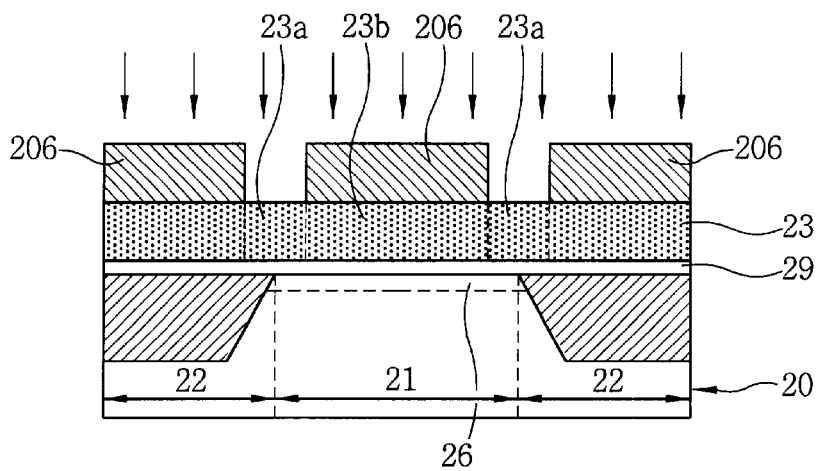

Referring to FIG. 5C, a second ion-implanting mask 206 is formed on a center part 23b with a channel 26 to be formed underneath the gate electrode 23 in an upper end of the active region 21. In other words, the second mask 206 is contiguous with the gate electrode 23 excepting a first part 23a. Referring to FIG. 5D, impurities of an inductive type, opposite to the impurities of the inductive type used in doping the inductive film when forming the gate electrode 23, are implanted with the second mask 206 into the first part 23a. For example, if the impurities used in doping the inductive film to form the gate electrode 23 are n-type impurities, then p-type impurities are implanted with the second mask 206. The preferred implantation dosage is $1 \times 10^{15}$ atoms/cm$^2$.

Figure 5E:
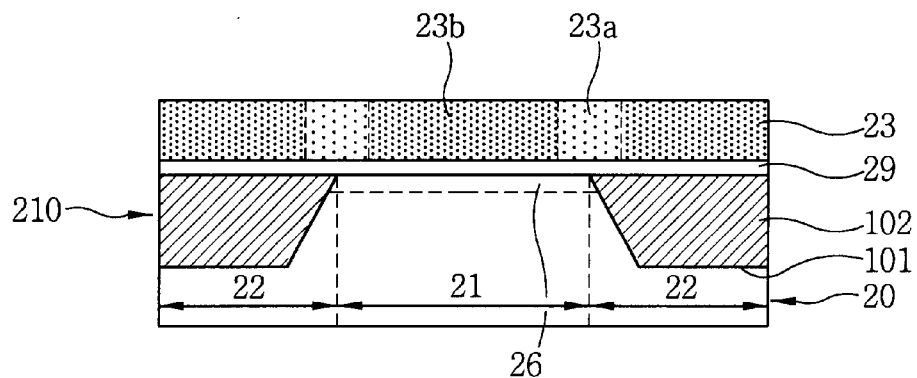

Referring to FIG. 5E, the second mask 206 is removed and a resulting second semiconductor structure 210 is annealed. After annealing, the center part 23b remains doped at the first concentration. In the first part 23a, counter-inductive type impurities are combined due to counter doping, so that the first part 23a becomes doped at a second concentration, the second concentration being lower than the first concentration. As the second concentration is lower than the first concentration, the second concentration is thus able to contribute to the actual flow of current.

Thereafter, n-type or p-type impurities are implanted into the active region 21, thereby forming a source 24 (not shown in FIGS. 5A through 5E) and a drain 25 (not shown in FIGS. 5A through 5E).

Figure 6A:
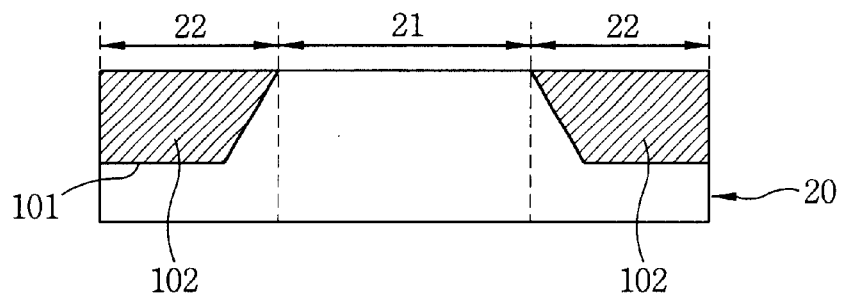
FIGS. 6A through 6F are cross-sectional views along line III—III of FIG. 2 illustrating a third embodiment of the semiconductor fabricated according to the claimed invention.

A third embodiment of the semiconductor fabricated according to the claimed invention is illustrated in FIGS. 6A through 6F. Those parts which are common to the claimed invention as illustrated by FIGS. 2, 3, 4A through 4E, and 5A through 5E are identified by the same numerals and will not be described in detail. Referring to FIG. 6A, a trench 101 is formed on a portion of a semiconductor substrate 20. The trench 101 is filled with an insulating film 102, such as silicon oxide to form an isolation region 22, thereby dividing the substrate 20 into the isolation region 22 and an active region 21.

Figure 6B:
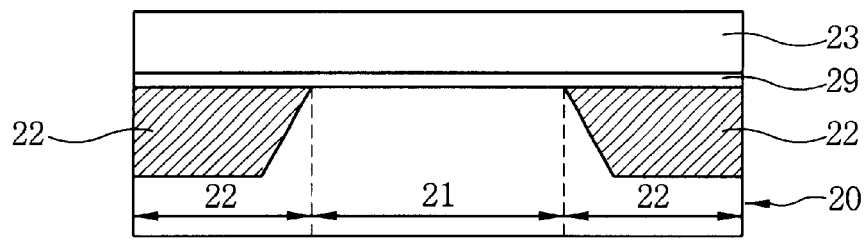

Referring to FIG. 6B, the gate oxide film 29 is formed on an entire upper surface of the active region 21 and the isolation region 22. An inductive film, preferably undoped polysilicon, is formed sequentially on a gate oxide film 29 and then patterned, thereby forming the gate electrode 23.

Figure 6C:
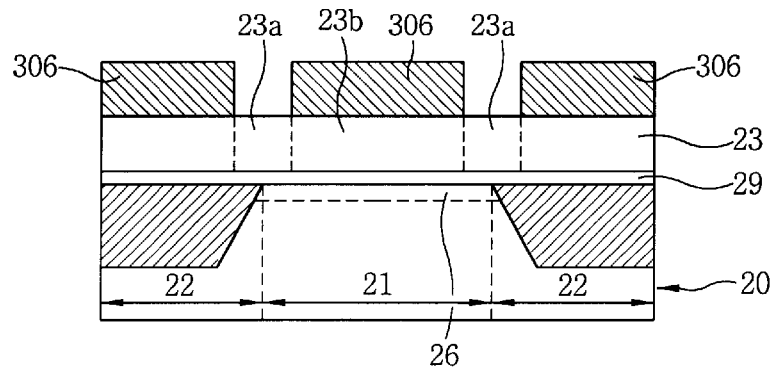

Referring to FIG. 6C, a third ion-implanting mask 306 is formed on a center part 23b with a channel 26 to be formed underneath the gate electrode 23 in an upper end of the active region 21. In other words, the third mask 306 is contiguous with the gate electrode 23 excepting the first part 23a of the gate electrode 23.

Figure 6D:
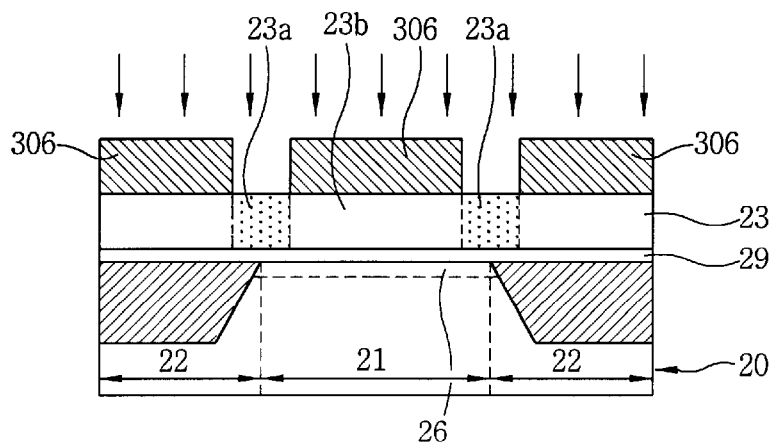
Figure 6E:
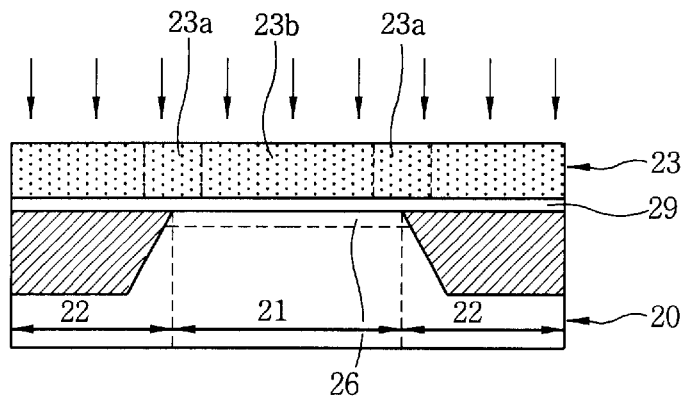

Referring to FIG. 6D, nitrogen ions are implanted into the first part 23a with an implantation dosage of $1 \times 10^{14}$ atoms/cm$^2$. Referring to FIG. 6E, the third mask 306 is removed. Impurities of n-type or p-type are ion-implanted into the entire gate electrode 23 with an implantation dosage of $1 \times 10^{15}$ atoms/cm$^2$.

Figure 6F:
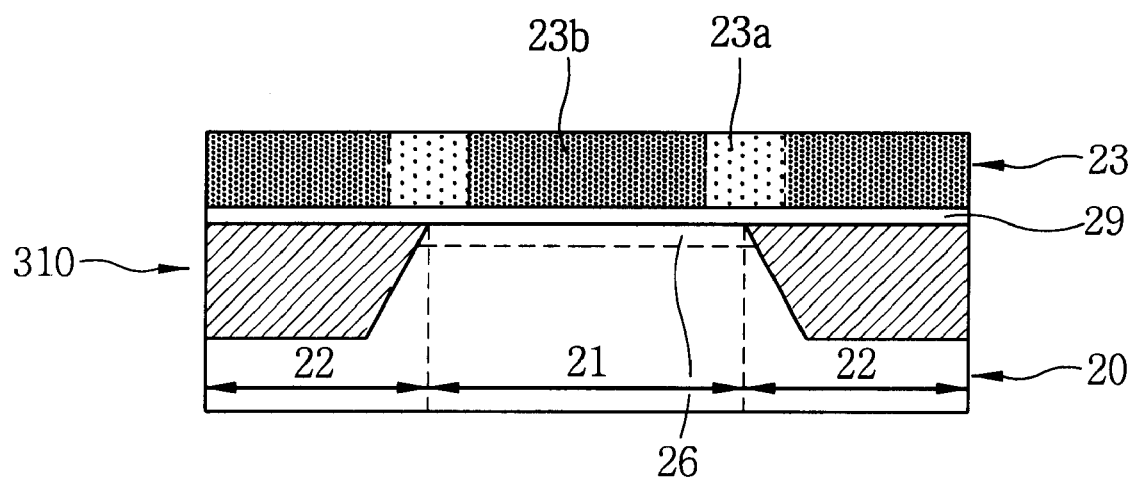

Referring to FIG. 6F, a resulting semiconductor structure 310 is annealed. Because the first part 23a is doped with nitrogen ions, the impurities do not readily spread. In the center part 23b, however, the impurities spread readily. Thus, the center part 23b is heavily doped with impurities compared with the first part 23a.

Thereafter, n-type or p-type impurity ions are implanted into the active region 21, thereby forming a source 24 (not shown in FIGS. 6A through 6F) and a drain 25 (not shown in FIGS. 6A through 6F).

In the claimed method of fabricating a semiconductor device as described in the various embodiments above, a gate electrode is formed with differently doped parts without implanting impurities into the semiconductor device. The claimed invention thereby eliminates a hump on a subthreshold current while maintaining performance characteristics of the semiconductor device.

It will be apparent to those skilled in the art that various modifications and variations can be made in the semiconductor device and the method of fabricating the semiconductor device of the claimed invention without departing from the spirit or scope of the invention. Thus, it is intended that the claimed invention cover the modifications and variations of this invention provided they come within the scope of the appended claims and their equivalents.

What is claimed is:

1. A method of fabricating a semiconductor device comprising the steps of:

dividing a semiconductor substrate into an isolation region and an active region;

forming a gate oxide film on a first upper surface of the active region;

forming a gate electrode on a second upper surface of the gate oxide film, the gate electrode having a first part and a second part, the first part and the second part being differently doped, wherein the first part is formed above boundaries between the active region and the isolation region, and the second part is formed above a center portion of the active region;

forming a channel in an upper end of the active region proximate the gate electrode; and forming a source and a drain by implanting impurities into the active region at both sides of the gate electrode.

2. The method of fabricating the semiconductor device according to claim 1, wherein the first part is lightly doped with impurities as compared to the second part.

3. The method of fabricating the semiconductor device according to claim 1, wherein the first part is doped at a concentration close to zero.

4. The method of fabricating the semiconductor device according to claim 1, wherein the step of dividing the substrate into the isolation region and the active region comprises the steps of:

forming a trench in the substrate; and filling the trench with an insulating film, wherein the insulating film includes silicon oxide.

5. A method of fabricating a semiconductor device comprising the steps of:

dividing a semiconductor substrate into an isolation region and an active region;

forming a gate oxide film on a first upper surface of the active region;

forming a gate electrode having differently doped first and second parts on a second upper surface of the gate oxide film by forming a polysilicon film on the gate oxide film, patterning the polysilicon film, forming an ion implanting mask on an upper surface of the first part, and implanting impurity ions into the second part;

forming a channel in an upper end of the active region proximate the gate electrode; and forming a source and a drain by implanting impurities into the active region at both sides of the gate electrode, wherein the first part is lightly doped with impurities as compared to the second part.

6. The method of fabricating the semiconductor device according to claim 2, wherein the step of forming the gate electrode comprises the steps of:

forming a conductive film doped with impurities of a first conductive type;

forming an ion implanting mask on an upper surface of the second part;

doping the first part with impurities of a second conductive type opposite to the first conductive type; and annealing the substrate.

7. A method of fabricating a semiconductor device comprising the steps of:

dividing a semiconductor substrate into an isolation region and an active region;

forming a gate oxide film on a first upper surface of the active region;

forming a gate electrode having differently doped first and second parts on a second upper surface of the gate oxide film by forming a conductive film on the gate oxide film, patterning the conductive film, implanting nitrogen ions into the first part, implanting n-type or p-type impurities into the entire gate electrode, and annealing the substrate, thereby doping the first part with impurities at a first concentration and the second part with impurities at a second concentration greater than the first concentration;

forming a channel in an upper end of the active region proximate the gate electrode; and forming a source and a drain by implanting impurities into the active region at both sides of the gate electrode, wherein the first part is lightly doped with impurities as compared to the second part.

8. The method of fabricating the semiconductor device according to claim 7, wherein the nitrogen ions are implanted with a dose of $1 \times 10^{14}$ atoms/cm$^2$.

9. The method of fabricating the semiconductor device according to claim 7, wherein the n-type or p-type impurities are implanted with a dose of $1 \times 10^{15}$ atoms/cm$^2$.

* * * * *